United States Patent
Hemon et al.

(10) Patent No.: US 9,157,955 B2
(45) Date of Patent: Oct. 13, 2015

(54) CHIP DAMAGE DETECTION DEVICE FOR A SEMICONDUCTOR INTEGRATED CIRCUIT

(75) Inventors: Erwan Hemon, Goyrans (FR); Philippe Lance, Toulouse (FR); Kurt Neugebauer, Vaterstetten (DE)

(73) Assignee: Freescale Semiconductor, Inc., Austin, TX (US)

( * ) Notice: Subject to any disclaimer, the term of this patent is extended or adjusted under 35 U.S.C. 154(b) by 280 days.

(21) Appl. No.: 13/522,865

(22) PCT Filed: Jan. 21, 2010

(86) PCT No.: PCT/IB2010/000606
§ 371 (c)(1),
(2), (4) Date: Jul. 18, 2012

(87) PCT Pub. No.: WO2011/089462
PCT Pub. Date: Jul. 28, 2011

(65) Prior Publication Data
US 2012/0286269 A1  Nov. 15, 2012

(51) Int. Cl.
*G01R 31/20* (2006.01)
*G01R 31/28* (2006.01)
*G01R 31/317* (2006.01)

(52) U.S. Cl.
CPC ... *G01R 31/31717* (2013.01); *H01L 2924/0002* (2013.01)

(58) Field of Classification Search
CPC ............... G01R 31/31717; H01L 2924/0002; H01L 2924/00
USPC .................. 324/750.03, 754.09; 714/726
See application file for complete search history.

(56) References Cited

U.S. PATENT DOCUMENTS

| 4,685,086 | A | | 8/1987 | Tran | |
|---|---|---|---|---|---|
| 5,157,335 | A | * | 10/1992 | Houston | 324/537 |
| 5,723,875 | A | | 3/1998 | Abe et al. | |
| 5,771,190 | A | * | 6/1998 | Okamura | 365/154 |
| 6,268,747 | B1 | * | 7/2001 | Barnes | 327/55 |
| 2004/0141363 | A1 | * | 7/2004 | Ohtsuka et al. | 365/154 |
| 2008/0184083 | A1 | * | 7/2008 | Isom et al. | 714/726 |
| 2009/0278404 | A1 | * | 11/2009 | Finke et al. | 307/9.1 |

FOREIGN PATENT DOCUMENTS

| ES | 2216468 T3 | 10/2004 |
|---|---|---|
| JP | 9129830 A | 5/1997 |
| KR | 20070089500 A | 8/2007 |

OTHER PUBLICATIONS

International Search Report and Written Opinion correlating to PCT/IB2010/000606 dated Nov. 2, 2010.

* cited by examiner

*Primary Examiner* — Jermele M Hollington
*Assistant Examiner* — Farhana Hoque

(57) ABSTRACT

A chip damage detection device is provided that includes at least one bi-stable circuit having a first conductive line passing through an observed area of a semiconductor integrated circuit chip for damage monitoring of the observed area. The at least one bi-stable circuit is arranged to flip from a first stable state into a second stable state when a potential difference between a first end and a second end of the first conductive line changes or when a leakage current overdrives a state keeping current at the first conductive line. Further, a semiconductor integrated circuit device that includes the chip damage detection device and a safety critical system that includes the semiconductor integrated circuit device or the chip damage detection circuit is provided.

21 Claims, 3 Drawing Sheets

US 9,157,955 B2

CHIP DAMAGE DETECTION DEVICE FOR A SEMICONDUCTOR INTEGRATED CIRCUIT

FIELD OF THE INVENTION

This invention relates to a chip damage detection device, a semiconductor integrated circuit device and a safety critical system.

BACKGROUND OF THE INVENTION

Semiconductor integrated circuits may be subject to malfunction or inoperability during operation caused by physical damage, for example cracks, of the integrated circuit (IC) die due to for example physical stress or heat. Especially when being used in a safety critical system such as for example a car safety system, this may result in a dangerous situation for a user of the system. Therefore, physical damage of the die must be handled properly.

A measurement for performance of a safety function or a target level of risk reduction is given by the Safety Integrity Level (SIL) which is defined for example by the International Electrotechnical Commission's (IEC) standard IEC 61508 as a relative level of risk-reduction provided by a safety function.

Further, steps of semiconductor integrated circuit fabrication such as the step of wafer dicing may involve applying physical stress to the die which may result in physical damage especially of border areas, i.e. wafer dicing may damage the die areas close to their edges. Later on, the die may get damaged for example during assembly in a system, for example when being placed on a printed circuit board.

In U.S. Pat. No. 5,723,875, a chip damage detection circuit for semiconductor IC is shown wherein the chip contains a chip check circuit for applying a scan testing technique. An actively driven detector line extends through several observed circuits. A signal is applied to the line and a possible damage is derived from monitoring variation of the output signal over time.

In US 2008/0184083 A1, another dynamic circuit and method for physical defect detection of an integrated circuit is shown. Here, a test line on the integrated circuit chip is connected to a power supply and to a complex continuity sense circuit for deriving damage from observed continuous current through the test line and detection of differences.

In KR10-2007-0089500, a circuit for detecting a defect of a repair fuse in a semiconductor device is shown. A first sense circuit is wired to an address fuse for sensing current flow through the fuse by observing a potential change at the fuse, a second sense circuit is wired to a repair fuse. Comparison of both sensed signals is used for determining operability of the fuses.

In JP09-129830, a semiconductor integrated circuit having damage detection means is shown. Here, a well potential monitoring circuit is integrated with the circuit to be observed. The monitoring circuit outputs an anomaly detection signal when a potential of a portion of a well in the substrate located within the observed integrated circuit is detected to be out of a predetermined range.

SUMMARY OF THE INVENTION

The present invention provides an integrated circuit device and a safety critical system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
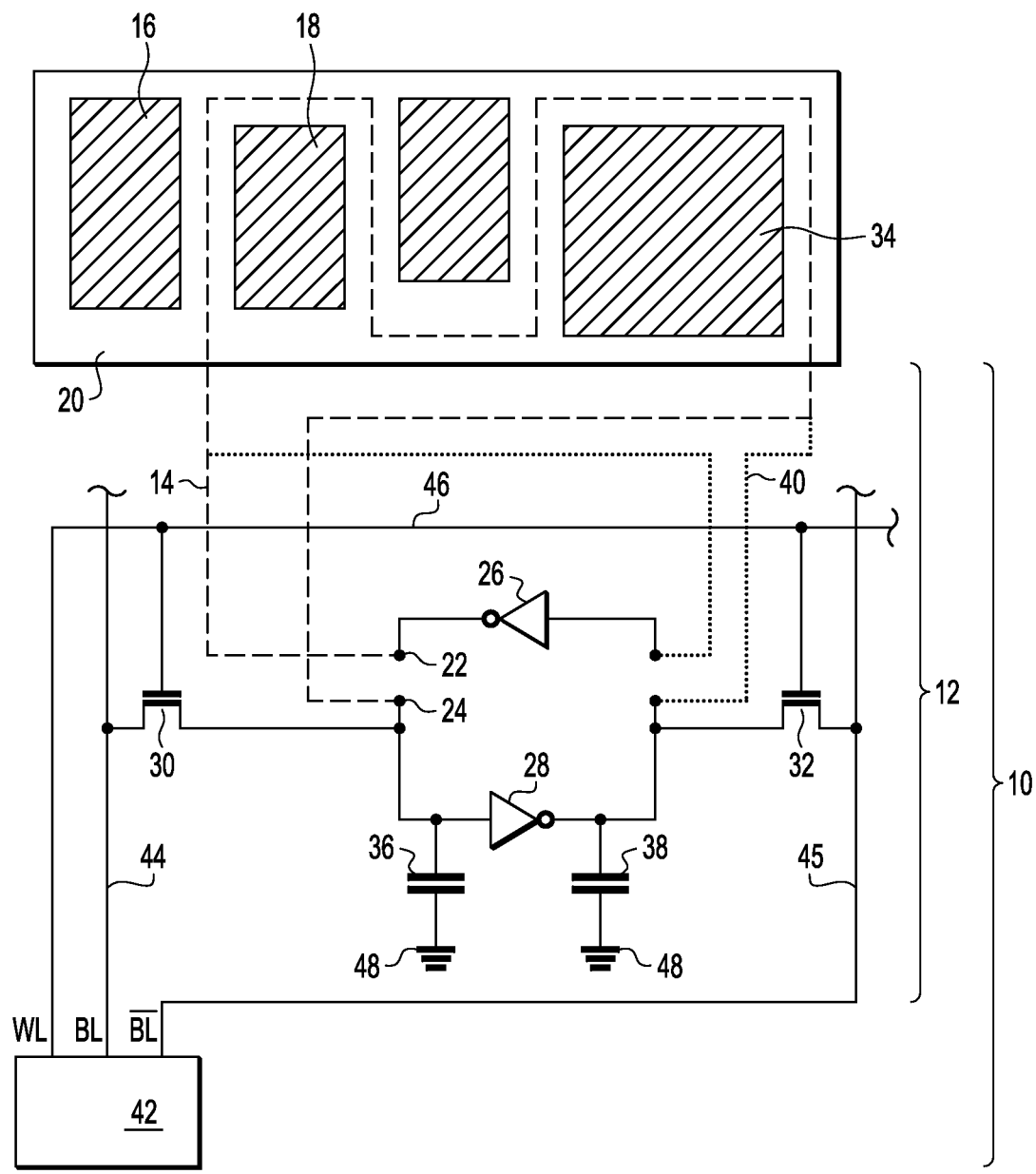
FIG. 1 schematically shows a first example of an embodiment of a chip damage detection device.

Referring to FIG. 1, a first example of an embodiment of a chip damage detection device 10 is shown. The chip damage detection device 10 may comprise at least one bi-stable circuit 12, i.e. a circuit having two stable states and thereby being capable of serving as one bit memory, comprising a first conductive line 14 passing through an observed area of an integrated circuit die 20 for damage monitoring of the observed area.

The bi-stable circuit 12 may be arranged to flip from a first into a second stable state when a potential difference between a first end 22 and a second end 24 of said line changes or when a leakage current overdrives a state keeping current at said first conductive line. The bi-stable circuit 12 may, for example due to of first conductive line 14 (illustrated as a dashed line), flip from the first into the second stable state when a state keeping current, i.e. the pull up or pull down current to be overcome to flip the bi-stable circuit 12, is removed or overdriven for example by a leakage current of an asymmetric leakage. The bi-stable circuit may comprise inverters 26, 28 and read/write access enabling switches 30, 32 which may be transistor circuits. Further, capacitances 36, 38 may for example be used for high frequency decoupling.

The bi-stable circuit 12 itself may be used to detect defects which make the bi-stable circuit 12 flip in one or the other direction. Extending the bi-stable circuit 12 over the to be observed area 16, 18, 34 allows for detecting defects such as die crack defects occurring or evolving over lifetime in applications. Other defect than cracks may also be detected.

In the example, for sake of simplicity only a single bi-stable circuit 12 is show with a single observed area. However, the chip damage detection device 10 may comprise one, or more than one, bi-stable circuits 12 for observing different areas of the semiconductor integrated circuit device 20 independently from each other.

If the extended line, i.e. the first conductive line 14 encounters damage, for example rupture or short-circuit, the potential difference between first 22 and second end 24 of the first extended line 14 may change, either increase or decrease, and may cause the bi-stable circuit 12 to flip into a second stable state. The potential difference may also change if the resistance of the extended conductive line 14 changes due to stress, distortion or partial disruption of the conductive line.

Without the first conductive line 14, which may also be referred to as a sense line, operation of the shown bi-stable circuit 12 may not be possible, because the first conductive line 14 is a part of the bi-stable circuit 12 and not just connected to it for sensing. Thus, if the bi-stable circuit 12 does not operate, this indicates that the observed area(s) is defective. The bi-stable circuit 12 may be symmetrical regarding electrical characteristics and may be in a first stable state, because both paths of the bi-stable circuit 12 may settle in equilibrium, but it may easily change state when one of the paths is subject to a change of potential, unbalancing the bi-stable circuit 12 and causing it to flip to the second state.

The first conductive line 14 may be implemented to pass through an observed area in any manner suitable for the specific implementation. As shown, for damage detection of the integrated circuit die 20, the first conductive line 14 of the bi-stable circuit 12 may extend in the observed area, and defines the sides of neighbouring regions 16, 18, 34 in the observed area, to detect damage in the interior of the observed area. The shown conductive line further extends along sides of the observed area to detect damage at the perimeter of the observed area. It will be apparent that the conductive line may be implemented in another shape and for example enclose the entire observed area to detect damage at the edges of the observed area. When observing die borders the first conductive line may for example be placed between an edge of the die and an integrated circuit area 34 sensitive to die cracks originating from the particular die edge. This may help check die border areas for example in a final test for cracks after fabrication, which could involve into the circuitry.

Figure 2:
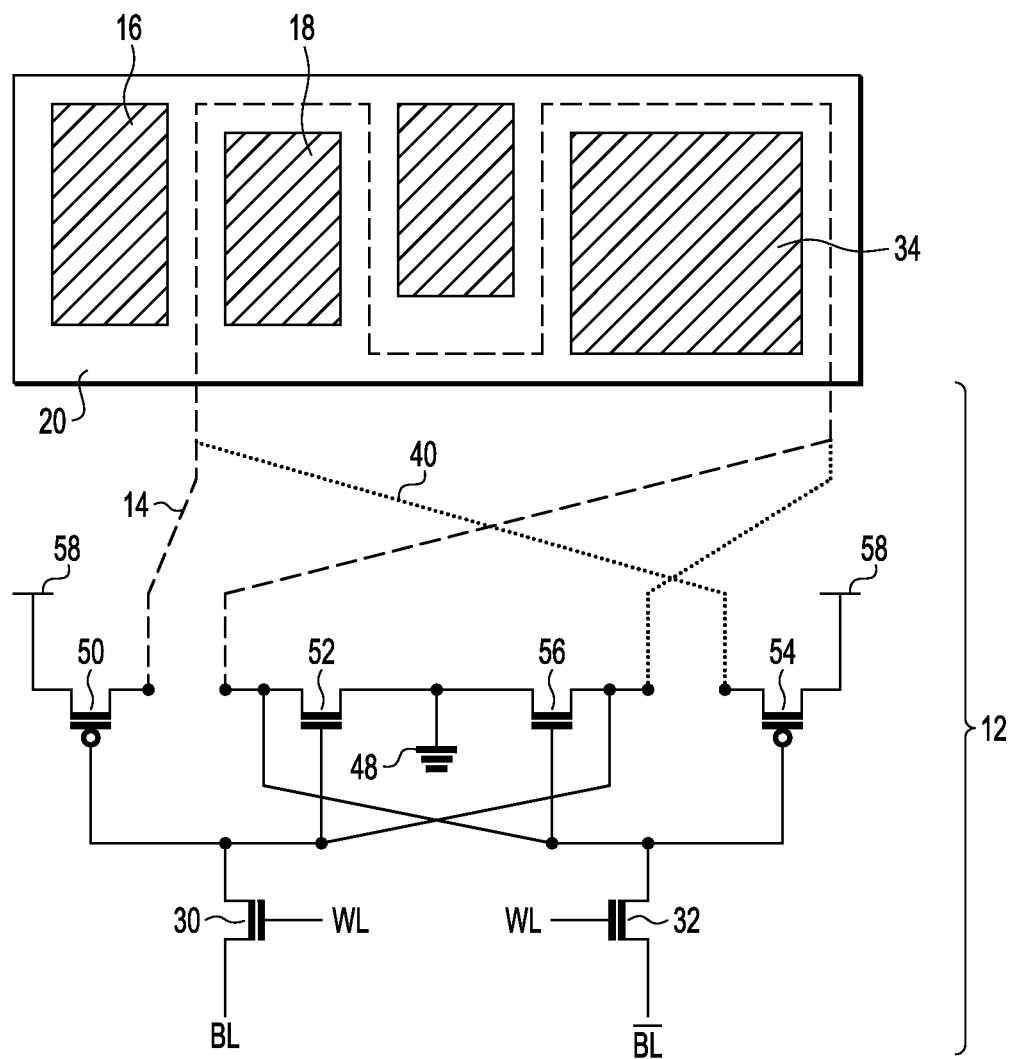
FIG. 2 schematically shows a second example of an embodiment of a chip damage detection device.
Figure 3:
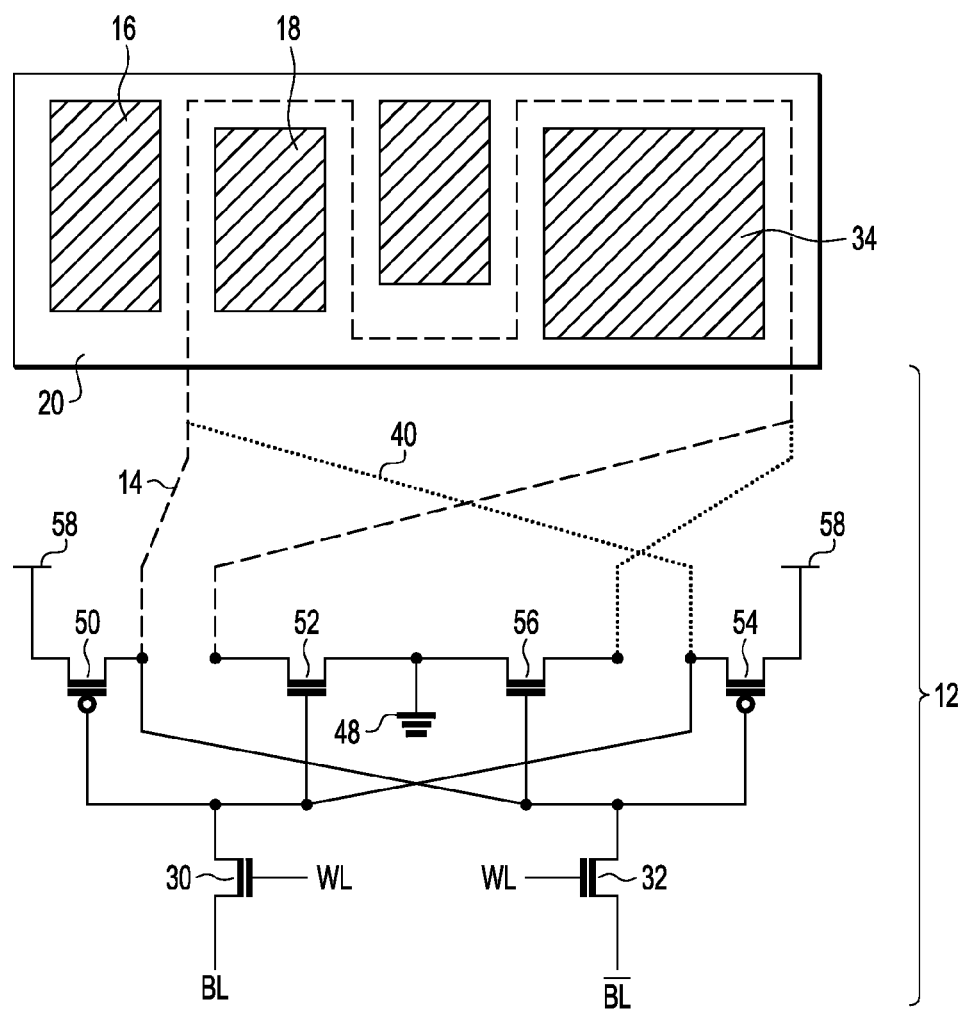
FIG. 3 schematically shows the third example of an embodiment of a chip damage detection circuit.

Referring now also to FIG. 2 and FIG. 3, a second and a third example of an embodiment of a chip damage detection device are schematically shown. The second and third examples are substantially similar but differ in that the extended conductive line 14, 40 connect to the rest of the bi-stable circuit with reversed connections, i.e. having the first and second end of the conductive line reversed. Testing the circuit using both types of circuit connections may allow for more reliable detection of the potential difference between the first and second end and more robust damage detection.

As shown in FIGS. 2 and 3, the at least one bi-stable circuit 12 may for example comprise a bit-cell which in this example consists of 6-transistors 30, 32, 50, 52, 54, 56. Each bit is stored on four transistors 50, 52, 54, 56 which in this example are connected such that they form two cross-coupled inverters. The shown bi-stable circuit may have two stable states. The bi-stable circuit may be connected to a voltage supply 58 and a reference potential 48, which may be earth or ground potential. Two additional access transistors 30, 32 serve to control the access to the bi-stable circuit during read and write operations. The shown bi-stable circuit uses six MOSFETs. The bi-stable circuit may serve to store a state information as a bit.

Other bi-stable circuits may for example use another number of transistors, such as more than 6, e.g. 8 or 10 transistors. This may for example be useful for implementing more than one read and/or write port. Anyway, the fewer transistors used per cell, the smaller each cell can be. Since the cost of processing a silicon wafer is relatively fixed, using smaller cells may reduce the cost per bi-stable circuit.

As shown in FIGS. 1-3, one or more of the bi-stable circuits 12 may comprise a second conductive line 40 (shown as a dotted line) passing through the observed area and located in parallel to the first conductive line 14. In the figures, first and second conductive lines 14, 40 are shown within die 20 as a single line in order to illustrate that they may be located very close to each other. However, both lines may not be conductively connected. Instead, they may for example be located within different layers of the semiconductor integrated circuit device.

In another embodiment, the second conductive line may be located in a completely different area of the die 20 for damage monitoring in a larger portion of the chip with the same bi-stable circuit, or in yet another embodiment may not be located on the same chip at all. The shown chip damage detection device may be operable when the second conductive line 40 is arranged to provide an electrical characteristic corresponding (for example, depending on the chosen implementation, identical or inverse) to an electrical characteristic of the first conductive line for providing symmetrical electrical conditions for both paths of the bi-stable circuit at least if the integrated circuit die 20 to be monitored is undamaged.

As shown in FIG. 1, the chip damage detection device 10 may comprise a controlling unit 42 connected to a bit line 44, 45 and a word line 46 WL of the at least one bi-stable circuit 12. This may provide the bit-cell type bi-stable circuit with read out circuitry for pull up, write, mux and sense functionality. Access to the bi-stable circuit may be enabled by the word line (WL in FIG. 1, 2, 3) which may control access transistors 30, 32, which may control whether the bi-stable circuit 12 should be connected to the bit lines BL and $\overline{BL}$. They may be used to transfer data for reading a current state of the bi-stable circuit. As shown both the signal and its inverse may be provided in order to improve noise margins. In another embodiment, only one of the bit lines may be provided. The controlling circuit may be arranged to read the current state of the bi-stable circuit.

The bit line may also be used for inititializing the bi-stable circuit in a first state state. The controlling unit 42 may be configured to set the first state of each of the at least one bi-stable circuits 12 to a configurable initial value. This may be performed by activating the word line and then applying said initialization value to the bi-stable circuit 12. After initial configuration, the controlling unit may be configured to check whether or not the state of the bi-stable circuit 12 has changed from the initialized first to the second state, which may indicate a damage in the first or second conductive line.

In an embodiment of the chip damage detection circuit dedicated to chip testing after fabrication, the bit line may be read once or few times. A use case could be to test IC for high-voltage applications on digital test platforms (such as the J750 prober, just to give an example). This may help reduce testing costs compared to probing using usually comparably expensive analogue IC test platforms.

In an embodiment of the chip damage detection device 10, the controlling unit 42 may be configured to regularly read out a state value of the at least one bi-stable circuit 12. This may allow for monitoring damage status of a device 20 over its lifetime, which may for example be important for safety critical systems, for example car safety systems where unexpected failure may result in a dangerous situation for the user of the system.

The bi-stable circuit 10 may be arranged such that the first conductive line 14 may be conductively connected solely, i.e. only, to the bi-stable circuit 12 at least when said semiconductor integrated circuit device 20 is in an undamaged condition. In other words, no intended conductive connection such as a metal connection may exist between circuit components or lines of the observed area 16, 18, 34 of the semiconductor integrated circuit device 20 and the first conductive line 14 of the chip damage detection circuit 10. If applicable, this may also refer to the second conductive line 40. This may be changed due to damage of the integrated circuit device 20. It should be noted that the presented detection device 10 may be able to detect damage no matter if damage causes a conductive connection between semiconductor integrated circuit device 20 and conductive line 14 of the bi-stable circuit 12 or not. The conductive line 14 may usually not comprise additional electronic components.

The first conductive line 14 may not be directly connected to a power supply. If present, this may also be applied to the second conductive line 40. The conductive line itself may be a passive means of a static circuit for damage monitoring and no or only very little current may flow through the line when no damage is being detected making it favourable for low power applications. As shown in FIG. 2 and FIG. 3, the bi-stable circuit 12 may be connected to a power supply 58, which may or may not be a power supply of the semiconductor integrated circuit device 20.

The chip damage detection device may be arranged to detect a damage of the semiconductor IC device 20. The chip damage detection device may for example be arranged to generate an alert signal when a state of at least one bi-stable circuit 12 flips from the first to the second state. This may be carried out by the controlling unit 42 which may be arranged to compare a read out current state of the bi-stable circuit with the initial reference state. Also, an alert signal may be triggered by the bi-stable circuit 12 itself in the event of the bi-stable circuit 12 flipping state. During normal chip operation, an alert signal may for example trigger a shut down of the die 20 or for example be provided to a visual display for informing a user of the system comprising the damaged chip about the detected malfunction. For example, in a car such an alert signal may be provided to the dashboard giving a visual information to the driver. A damaged chip may for example be deactivated or put into a failsafe state.

During semiconductor IC fabrication, a chip tested and found damaged may be discarded. This may help zero defect fabrication. Statistical information which area of the IC die 20 often encounter damage may for example be used for changing parameters of the fabrication process.

As described above, the chip damage detection device 10 may be arranged to detect damage during normal operation of the circuitry on the semiconductor integrated circuit die 20. This may allow for monitoring damage state during the whole lifetime of the chip. In an embodiment which is not only intended for test during fabrication, chip damage detection device 10 and semiconductor IC device 20 may be permanently connected.

Figure 4:
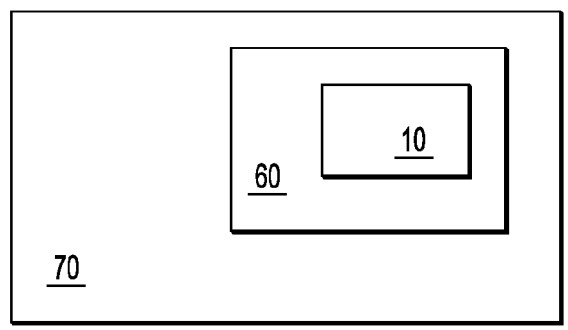
FIG. 4 schematically shows an example of an embodiment of a safety critical system having a semiconductor integrated circuit device with a chip damage detection device.

Referring now also to FIG. 4 an example of an embodiment of a safety critical system 70 having a semiconductor integrated circuit device 60 with a chip damage detection device 10 is shown. A semiconductor integrated circuit device 60 may comprise at least one chip damage detection device 10 as described above. Here, one or more chip damage detection devices 10 may be permanently connected to the semiconductor IC die 20 of the semiconductor IC device. More than one detection device may for example be used when the chip comprises more than one functional block requiring different levels of operation safety. For example, in a car an integrated circuit device may comprise a functional unit dedicated to airbag operability requiring a high level of operational safety.

In an embodiment of the semiconductor IC device, the chip damage detection device 10 may not only be permanently connected to but may be integrated with said semiconductor integrated circuit chip in a single die. This may for example be useful because the damage detection circuit may be designed to monitor damage status of the semiconductor IC device during the whole lifetime of the semiconductor IC device and when a detected damage may cause replacement of the whole chip anyway. The presented chip damage detection device may be very small concerning required die area compared to the die area used for the semiconductor integrated circuit chip.

As shown in FIG. 4, a safety critical system 70 may comprise a semiconductor integrated circuit device 60 or a chip damage detection device 10 as described above. A safety critical system 70 may benefit from an additional level of security, robustness and reliability and may for example be any application wherein unexpected malfunction could for example cause a potentially dangerous situation for a user. The presented system may for example allow for complying with a desired safety integrity level (SIL), such as for example SIL3 according to the IEC 61508 standard issued by the International Electrotechnical Commissions (IEC). However, it may comply with IEC 61511 standard or any other standard defining a safety integrity level. A safety critical system 70 may for example be found in a vehicle, for example in a car, a plane, a ship, a helicopter etc., that is a safety critical system 70 may be found, for example, in an automotive environment and may be, for example, a car safety system. A safety critical system 70 may comprise an airbag system, a seat position control system, lighting, windscreen wipers, immobilizers, electronic climate control, a brake system or an electrical steering system, just to name a few. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. However, the semiconductor device may also be used for other car systems, such as for example the dashboard.

Referring back to FIG. 1, the shown controlling unit may be implemented using electronic circuits. Or it may at least partly operate depending on code portions of a computer program or may for example by a state machine at least partly implemented in a programmable logic array (PLA), a field programmable gate array (FPGA) or the like.

In the foregoing specification, the invention has been described with reference to specific examples of embodiments of the invention. It will, however, be evident that various modifications and changes may be made therein without departing from the broader spirit and scope of the invention as set forth in the appended claims. For example, the bi-stable circuit 12 may be implemented in any manner suitable for the specific implementation. The bi-stable circuit 12 may for example be a latch, a flip-flop circuit, a bit-cell of a random access memory (RAM), for example a static RAM (SRAM) or any other type of suitable bi-stable circuit. Available RAM layouts may therefore be arranged to additionally provide for an extended first conductive line passing through an integrated circuit device. Also, the die described herein can be of any suitable material or combinations of materials, such as semiconductor materials like gallium arsenide, silicon germanium, silicon-on-insulator (SOI), silicon, monocrystalline silicon, the like, and combinations of the above. Furthermore, the connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, a plurality of bi-stable circuits 12 may be implemented as a register or RAM wherein at least some bit cells comprise conductive paths extending through the semiconductor integrated circuit device 20.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the bi-stable circuit 12 may be completely integrated with the semiconductor integrated circuit device 20.

Alternatively, the examples may be implemented as any number of separate integrated circuits or separate devices interconnected with each other in a suitable manner. For example, the extended conductive lines 14, 40 of the chip damage detection device 10 may be located on the semiconductor IC chip and the remaining part of the detection device 10 may be located on a separate chip, for example temporarily connectable to the IC die 20.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising:
   an integrated circuit die including a first conductive line passing through an area of the integrated circuit to be observed, said first conductive line having a first end and a second end; and
   a chip damage detection device to detect a change in electrical characteristics of said first conductive line caused by physical damage to said integrated circuit die, said chip damage detection device comprising a bi-stable circuit including a first inverter and a second inverter, said first end of said conductive line connected to an output of said first inverter and said second end of said conductive line connected to an input of said second inverter;
   wherein said bi-stable circuit is configured to flip from a first stable state into a second stable state when a potential difference between said first end and said second end of said first conductive line changes or when a leakage current at said first conductive line overdrives a state keeping current at said bi-stable circuit.

2. The integrated circuit as claimed in claim 1, wherein said bi-stable circuit comprises a 6-transistor bit-cell.

3. The integrated circuit as claimed in claim 1, wherein said bi-stable circuit comprises a bit-cell of a random access memory.

4. The integrated circuit as claimed in claim 1, further comprising:
a second conductive line passing through said observed area and located in parallel to said first conductive line, a first end of said second conductive line connected to said output of said first inverter and a second end of said second conductive line is connected to said input of said second inverter.

5. The integrated circuit as claimed in claim 1, wherein said chip damage detection device comprises a controlling unit connected to a bit line and a word line of said bi-stable circuit.

6. The integrated circuit as claimed in claim 5, wherein said controlling unit is configured to set said first state of said bi-stable circuit to a configurable initial value.

7. The integrated circuit as claimed in claim 5, wherein said controlling unit is configured to regularly read out a state value of said bi-stable circuit.

8. The integrated circuit as claimed in claim 1, wherein said first conductive line is conductively connected solely to said bi-stable circuit at least when said semiconductor integrated circuit device is in an undamaged condition.

9. The integrated circuit as claimed in claim 1, arranged to generate an alert signal when a state of said bi-stable circuit flips from said first stable state to said second stable state.

10. The integrated circuit as claimed in claim 1, wherein said chip damage detection device is arranged to detect a damage to said integrated circuit die during normal operation of said semiconductor integrated circuit device.

11. The integrated circuit as claimed in claim 1, wherein said chip damage detection device is integrated with said observed areas in a single die.

12. The integrated circuit as claimed in claim 1, wherein said observed area comprises a die boundary.

13. The integrated circuit device of claim 1, wherein said bi-stable circuit is configured to flip from said first stable state into said second stable state when said potential difference between said first end and said second end of said first conductive line changes.

14. The integrated circuit device of claim 1, wherein said bi-stable circuit is configured to flip from the said first stable state into said second stable state when said leakage current at said first conductive line overdrives said state keeping current.

15. A method comprising:
providing a first conductive line passing through an area of an integrated circuit die to be observed, said first conductive line having a first end and a second end; and
detecting, at a chip damage detection device, a change in electrical characteristics of said first conductive line caused by physical damage to said integrated circuit die, said chip damage detection device comprising a bi-stable circuit including a first inverter and a second inverter, said first end of said conductive line connected to an output of said first inverter and said second end of said conductive line connected to an input of said second inverter;
wherein said bi-stable circuit is configured to flip from a first stable state into a second stable state when a potential difference between said first end and said second end of said first conductive line changes or when a leakage current at said first conductive line overdrives a state keeping current at said bi-stable circuit.

16. The method of claim 15, wherein said bi-stable circuit is configured to flip from said first stable state into said second stable state when said potential difference between said first end and said second end of said first conductive line changes.

17. The method of claim 15, wherein said at least one bi-stable circuit is configured to flip from said first stable state into said second stable state when said leakage current at said first conductive line overdrives said state keeping current.

18. The method of claim 15, wherein said first conductive line is conductively connected solely to said bi-stable circuit at least when said semiconductor integrated circuit device is in an undamaged condition.

19. The method of claim 15, wherein said chip damage detection device is arranged to detect damage to said integrated circuit die during normal operation of said semiconductor integrated circuit device.

20. A method comprising:
identifying a first region of an integrated circuit die to be observed;
providing a first conductive line passing through said first region, said first conductive line including a first end and a second end;
connecting said first end of said first conductive line to an output of a first inverter of a bi-stable circuit;
connecting said second end of said first conductive line to an input of a second inverter of said bi-stable circuit;
connecting an output of said second inverter to an input of said first inverter; and
detecting a change in electrical characteristics of said first conductive line caused by physical damage to said integrated circuit die, said change in said electrical characteristics causing said bi-stable circuit to flip from a first stable state into a second stable state when a potential difference between said first end and said second end of said first conductive line changes or when a leakage current at said first conductive line overdrives a state keeping current at said bi-stable circuit.

21. The method of claim 20, wherein said first conductive line is conductively connected solely to said bi-stable circuit at least when said semiconductor integrated circuit device is in an undamaged condition.

* * * * *